(12) United States Patent
Okura et al.

(10) Patent No.: US 10,069,053 B2
(45) Date of Patent: Sep. 4, 2018

(54) LIGHT EMITTING DEVICE HAVING WIRE INCLUDING STACK STRUCTURE

(71) Applicant: NICHIA CORPORATION, Anan-shi, Tokushima (JP)

(72) Inventors: Shinya Okura, Tokushima (JP); Shintaro Nakashima, Tokushima (JP); Hiroki Fukuta, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/499,421

(22) Filed: Sep. 29, 2014

(65) Prior Publication Data

US 2015/0091027 A1    Apr. 2, 2015

(30) Foreign Application Priority Data

Sep. 30, 2013  (JP) .................................. 2013-203440

(51) Int. Cl.

| | |
|---|---|
| *H01L 29/18* | (2006.01) |
| *H01L 33/62* | (2010.01) |
| *H01L 33/58* | (2010.01) |
| *H01L 33/50* | (2010.01) |

(52) U.S. Cl.
CPC .............. *H01L 33/62* (2013.01); *H01L 33/58* (2013.01); *H01L 33/505* (2013.01); *H01L 2224/48471* (2013.01); *H01L 2224/48479* (2013.01); *H01L 2924/00014* (2013.01)

(58) Field of Classification Search
CPC ..... H01L 2224/4807; H01L 2224/4845; H01L 2224/85051; H01L 2224/1134; H01L 2224/48227; H01L 2924/12041; H01L 33/62; H01L 33/505; G02B 6/4201
See application file for complete search history.

(56) References Cited

U.S. PATENT DOCUMENTS

| | | | | |
|---|---|---|---|---|
| 4,418,284 A | * | 11/1983 | Ogawa .................. | G03F 7/0007 156/263 |
| 2002/0079354 A1 | * | 6/2002 | Lee ........................... | 228/180.5 |
| 2003/0230796 A1 | * | 12/2003 | Ismail ..................... | H01L 24/49 257/686 |
| 2004/0115918 A1 | * | 6/2004 | Kanda ..................... | H01L 24/48 438/612 |
| 2005/0242159 A1 | * | 11/2005 | Yajima ................. | B23K 20/004 228/180.5 |

(Continued)

FOREIGN PATENT DOCUMENTS

| | | |
|---|---|---|
| JP | 2000-049384 A | 2/2000 |
| JP | 2007-019096 A | 1/2007 |

(Continued)

*Primary Examiner* — Thao X Le
*Assistant Examiner* — Laura Dykes

(57) ABSTRACT

A light emitting device of the invention includes a substrate; a light emitting element mounted on the upper surface of the substrate; a wire that is electrically connected to the light emitting element; and a plate-shaped light-transmissive member that covers the light emitting element. The wire has a stack structure in which a first bonding ball, a bonding wire, and a second bonding ball are stacked in that order, the stack structure is disposed on the upper surface of the light emitting element, and the plate-shaped light-transmissive member is disposed above the stack structure.

15 Claims, 4 Drawing Sheets

(56) References Cited

U.S. PATENT DOCUMENTS

| | | | |
|---|---|---|---|
| 2006/0065964 A1* | 3/2006 | Ohsumi | H01L 21/56 257/690 |
| 2006/0163590 A1* | 7/2006 | Erchak | F21K 9/00 257/88 |
| 2006/0268144 A1* | 11/2006 | Tan | H01L 27/14618 348/340 |
| 2008/0121911 A1 | 5/2008 | Andrews et al. | |
| 2010/0140648 A1* | 6/2010 | Harada | H01L 33/60 257/98 |
| 2010/0149816 A1 | 6/2010 | Higashi et al. | |
| 2010/0283065 A1* | 11/2010 | Yen | H01L 33/54 257/88 |
| 2012/0025218 A1 | 2/2012 | Ito et al. | |
| 2012/0025243 A1* | 2/2012 | Lin | H01L 33/54 257/98 |
| 2012/0104452 A1 | 5/2012 | Miyoshi et al. | |
| 2012/0193784 A1 | 8/2012 | Togasaki et al. | |
| 2012/0211774 A1 | 8/2012 | Harada | |
| 2012/0242216 A1 | 9/2012 | Kotani et al. | |
| 2012/0274203 A1* | 11/2012 | Yokotani | H01L 33/505 313/512 |
| 2013/0009174 A1 | 1/2013 | Hsu et al. | |
| 2014/0239320 A1 | 8/2014 | Miyoshi et al. | |
| 2015/0270456 A1 | 9/2015 | Miyoshi et al. | |
| 2016/0133800 A1 | 5/2016 | Miyoshi et al. | |

FOREIGN PATENT DOCUMENTS

| | | |
|---|---|---|
| JP | 2007-080876 A | 3/2007 |
| JP | 2008-166740 A | 7/2008 |
| JP | 2010-141273 A | 6/2010 |
| JP | 2010-157638 A | 7/2010 |
| JP | 2010-219324 A | 9/2010 |
| JP | 2010-225960 A | 10/2010 |
| JP | 2010-273087 A | 12/2010 |
| JP | 2012-033823 A | 2/2012 |
| JP | 2012-099545 A | 5/2012 |
| JP | 2012-160554 A | 8/2012 |
| JP | 2012-169442 A | 9/2012 |
| JP | 2012-186103 A | 9/2012 |
| JP | 2012-199411 A | 10/2012 |

* cited by examiner

LIGHT EMITTING DEVICE HAVING WIRE INCLUDING STACK STRUCTURE

CROSS-REFERENCE TO RELATED APPLICATION

This application claims priority to Japanese Patent Application No. 2013-203440, filed on Sep. 30, 2014. The entire disclosure of Japanese Patent Application No. 2013-203440 is hereby incorporated herein by reference.

BACKGROUND OF THE INVENTION

Field of the Invention

The present disclosure relates to a light emitting device, and more precisely relates to a light emitting device comprising a light emitting element of the type in which a wire is electrically connected to the light emitting element by wire bonding.

Description of the Related Art

A light emitting device has been proposed in the past in which various wavelength conversion members that emit light of different hues by exciting light emitted from a light emitting element that is compact and has good power efficiency are combined with this light emitting element, allowing light to be emitted in a wide range of colors.

When the wavelength conversion members are combined with the light emitting element, a light-transmissive member in the form of a sheet or plate and comprising or including a wavelength conversion member is disposed on the rear surface side (the side where the electrodes are not formed) of a light emitting element mounted face down, which gives a light emitting device at a high yield (see JP2007-19096A).

Also, a light emitting device has been proposed in which the light emitting element is mounted in a face-up manner and wavelength conversion members are disposed on the side of the light emitting element where the electrodes are formed, by manipulating the shape of the substrate on which the light emitting element is mounted (see JP2010-273087A), or using a small plate-shaped body that allows wire bonding of the light emitting element to be avoided (see JP2012-169442A), or combining a resin layer containing a wavelength conversion member between the plate-shaped body and the light emitting element, or covering the wavelength conversion member away from the wires (see JP2007-80876A), or routing the wires around (see JP2008-166740A).

Even if the light emitting element is combined with a small light-transmissive member comprising or containing a wavelength conversion member, or if the shape of the substrate on which the light emitting element is mounted is manipulated, misalignment or the like during disposition of the light-transmissive member can cause the bonding wires in the light emitting element to hinder the disposition of the light-transmissive member. As a result, it becomes difficult to stably dispose the light-transmissive member on the light emitting element.

Also, making the light-transmissive member smaller with respect to the light emitting element, or only disposing the light-transmissive member locally makes it difficult to effectively guide all of the light emitted from the light emitting element into light-transmissive member. Furthermore, routing the wires increases absorption of the light emitted from the light emitting element, or the bonding wires can come into contact with the light emitting element or the light-transmissive member by routing, which can lead to wire breakage. Consequently, these may lead to decreased light output.

SUMMARY OF THE INVENTION

The present disclosure was conceived in an effort to solve these problems, and it is an object thereof to provide a light emitting device including a light emitting element of the type in which a wire is electrically connected to the light emitting element by so-called wire bonding, wherein the light-transmissive member will not come into contact with the bonding wire, etc., even if there is misalignment, and there is no decrease in light output.

The inventors conducted various studies into what hinders the stable disposition of the light-transmissive member in a light emitting device including a light emitting element of the type in which a wire is electrically connected to the light emitting element by wire bonding, and as a result, they discovered that the very form of the bonding wire, which is attributable to the wire bonding method, tends to lead to contact with the light-transmissive member, and that by adjusting this form, it is possible to dramatically reduce or avoid contact of the bonding wire with the light-transmissive member regardless of the alignment accuracy.

The present disclosure provides a light emitting device includes a substrate; a light emitting element mounted on the upper surface of the substrate; a wire that is electrically connected to the light emitting element; and a plate-shaped light-transmissive member that covers the light emitting element. The wire has a stack structure in which a first bonding ball, a bonding wire, and a second bonding ball are stacked in that order, the stack structure is disposed on the upper surface of the light emitting element, and the plate-shaped light-transmissive member is disposed above the stack structure.

According to this disclosure, it is possible to provide the light emitting device including a light emitting element of the type in which a wire is electrically connected to the light emitting element by so-called wire bonding, wherein the translucent member will not come into contact with the bonding wire, etc., even if there is misalignment, and there is no decrease in light output. misalignment, and there is no decrease in light output.

DETAILED DESCRIPTION OF THE INVENTION

Figure 1A:
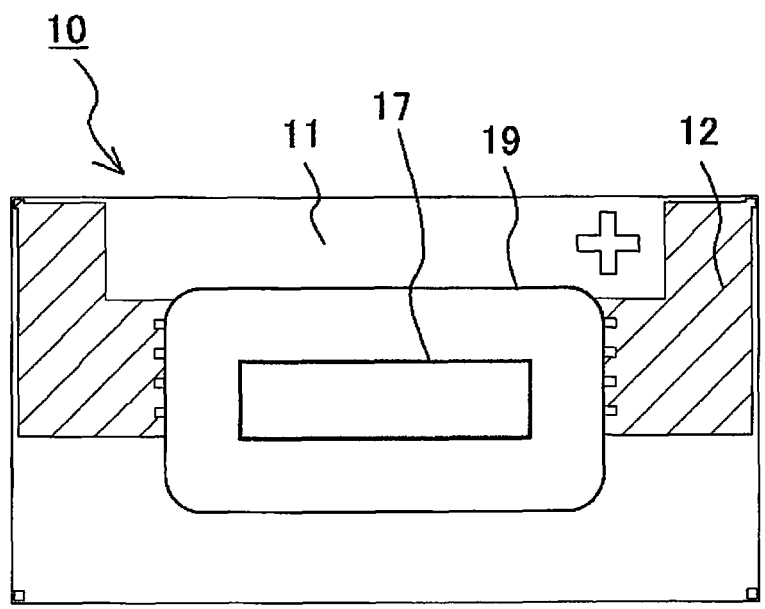
FIG. 1A is a simplified plan view of the main components in an embodiment of the light emitting device of the present invention.
Figure 1B:
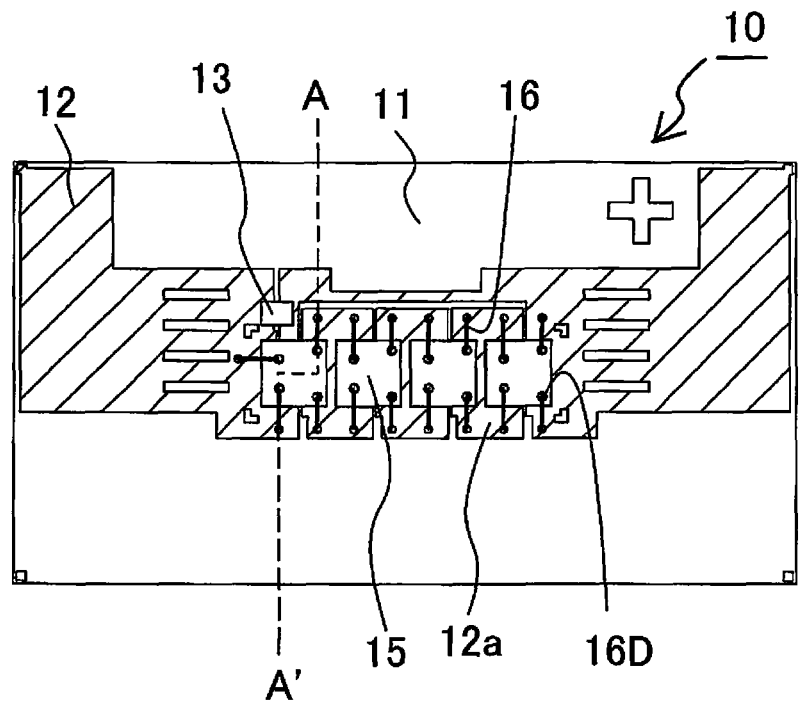
FIG. 1B is a simplified plan view of the main components of the light emitting device in FIG. 1A, with the plate-shaped light-transmissive member and the light reflecting member omitted.

Embodiments for implementing the light emitting device of the present disclosure will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. In addition, a plurality of structural elements of the present invention may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

The light emitting device of the present invention comprises a substrate, a light emitting element, a wire, and a plate-shaped light-transmissive member. The light emitting device comprising these components can optionally further comprise a light transmissive member that is disposed between the light emitting element and the plate-shaped light-transmissive member, a light reflecting member that covers the side surface of the light emitting element, and so forth.

Substrate

A light emitting device usually comprises a substrate for mounting a light emitting element.

The substrate is usually formed of the insulating materials such as a glass-epoxy resin (glass fibre reinforced epoxy resin), a ceramic (HTCC: High Temperature Co-fired Ceramics, LTCC: Low Temperature Co-fired Ceramics), or a composite material of the insulating material and metal member. A ceramic with high thermostability and weatherability is preferably used for the substrate material. Examples of the ceramic include alumina, aluminum nitride, mullite and the like. An insulating material such as a bismaleimide-triazine resin, a glass-epoxy resin, an epoxy-based resin can combine with such ceramic material.

The substrate used here is usually one that has a wiring pattern connected to the light emitting element on its surface and/or in its interior. The wiring pattern can be formed of a metal such as Cu, Al, Au, Ag, W, Fe and Ni, or an alloy such as Fe—Ni alloy, phosphor bronze. Also, in the case where the wiring pattern is disposed on the surface, that surface can be given a reflective plating so that light from the light emitting element mounted on the substrate can be extracted more efficiently. The wiring pattern can be curved or distorted on the substrate surface or interior. The thickness of the wiring pattern can be from a few microns to a few hundred microns, for example.

A substrate such as this is known in this field, and any substrate that is used for the mounting of light emitting elements and the like can be used.

In addition to being electrically connected to the light emitting element, the wiring pattern can also be used to impart other functions, such as mounting a light emitting element or a protective element, improving heat dissipation, or electrically connecting to a protective element.

Light Emitting Element

The light emitting element used in this disclosure means an element so-called light emitting diode. Examples thereof include a laminated structure that is formed on a substrate and has an active layer formed from various semiconductor such as a nitride semiconductor such as InN, AlN, GaN, InGaN, AlGaN, InGaAlN, a III-V compound semiconductor, a II-V compound semiconductor.

The light emitting element can be one in which positive and negative electrodes are formed on opposite side surfaces respectively, or the positive and negative electrodes can both be formed on the same side. The pair of electrodes in the latter case can be disposed at the same height, or there can be a height difference between the electrodes. There need not be one each of the positive and negative electrodes, and two or more of each can be formed.

There are no particular restrictions on the material, thickness, or structure of the electrodes, and they can be either a single-layer structure or laminated structure of a metal such as Au, Cu, Pb, Al or an alloy thereof. Further, pad electrodes can be formed of either a single-layer structure or laminated structure of a metal such as Ni, Ti, Au, Pt, Pd, W or an alloy thereof on surfaces of the electrodes. There are no particular restrictions on the film thickness of the pad electrode, but it is preferable that gold is disposed at the last layer (i.e. the outmost surface), and that the thickness of the film is about 100 nm or more.

The light emitting element is usually mounted on the upper surface of the above-mentioned substrate, and fixed by a bonding member.

If the light emitting element has positive and negative electrodes on opposite surfaces, the light emitting element is mounted on the wiring pattern of the substrate, and the surface on which one of the electrodes (hereinafter also referred to as the first electrode) is formed (hereinafter also referred to as the first surface or rear surface) is preferably fixed by a bonding member such as a conductive paste containing Ag, Au, Pd, or the like. This allows the first electrode disposed on the rear surface to be electrically connected to the wiring pattern of the substrate by the conductive paste.

The other surface of the light emitting element on which the other electrode (hereinafter also referred to as the second electrode) is formed (hereinafter also referred to as the second surface or upper surface) is disposed on the opposite side from the substrate, and the second electrode is electrically connected to a wire as discussed below. The wire connected to the second electrode is preferably also electrically connected to the wiring pattern of the substrate, but within a single light emitting element, can be connected between the electrodes within the second electrode, or can be connected between the electrodes among two or more light emitting elements. In this case, the second electrode can be connected by the wire at just one place, but can also be connected at two or more places. For example, it can be connected to the wiring pattern at just one place or at two or more places, or can be connected to the wiring pattern by wires at a second electrode that has been divided into two more parts. When there are wire connections at two or more places on the upper surface, the plate-shaped light-transmissive member (discussed below) can be disposed more stably.

When a light emitting element is used that has positive and negative electrodes on the same side thereof, the surface on the side where the electrodes are not formed (hereinafter also referred to as the first surface or rear surface) can be fixed to the substrate with an epoxy resin, silicone, or another such bonding member. Also, since heat or light from the light emitting element can result in degradation, the rear surface of the light emitting element can be metal plated with Al, Ag, or the like, and a solder such as eutectic Au—Sn, a braze made of a low-melting point metal or the like, a conductive paste, or another such bonding member can be used as a bonding material. These electrodes, as discussed below, are electrically connected by wires. In this case, these electrodes are preferably respectively electrically connected to the wiring pattern of the substrate by wires, but as mentioned above, inter-electrode connection can be performed within electrodes of the same conduction type in a single light emitting element, or inter-electrode connection can be performed between two or more light emitting elements.

Because of this, with the light emitting device of the embodiment of the present invention, just one light emitting element can be mounted in one light emitting device, or a plurality of elements can be mounted. When a plurality of light emitting elements are mounted, there are no particular restrictions on how they are arranged, and they can be in parallel, in series, or in a combination of these, for example.

Wires

As discussed above, the wires are conductive members that are electrically connected to the light emitting element. The wires are electrically connected to the electrodes formed on the surface of the light emitting element. The wires can also be electrically connected to the wiring pattern of the substrate, or to the electrodes of another light emitting element, or to electrodes of the light emitting element. Therefore, the wires preferably have good ohmic contact with the electrodes of the light emitting element, or good mechanical connectability, or good electrical and thermal conductivity. The thermal conductivity is preferably at least about 0.01 cal/S·cm$^{2\cdot\circ}$ C./cm, and more preferably at least about 0.5 cal/S·cm$^{2\cdot\circ}$ C./cm. When ease of work and so forth are taken into account, the wire diameter is preferably about 1 to 45 µm. Examples of the wire material include Au, Ag, Cu, Pt, Al, and other such metals, as well as alloys of these. Among those, Au is especially preferable from the standpoints of joint reliability, stress release after bonding, and so forth.

The wires can be electrically connected by a known bonding method to the light emitting element, to the wiring pattern, and between light emitting elements or electrodes.

The wires have a stack structure in which a first bonding ball, a bonding wire, and a second bonding ball are stacked in that order. This stack structure is preferably disposed at the part that is electrically connected with the light emitting element, that is, the upper surface of the light emitting element, and in particular the upper surface of the electrodes of the light emitting element. This stack structure allows the plate-shaped light-transmissive member (discussed below) to be disposed without leading to breakage of the bonding wire, etc., through contact, regardless of whether or not there is any misalignment, in a light emitting device of the type in which a light emitting element is electrically connected to wiring by wire bonding, such as in a light emitting device that includes a face-up type of light emitting element.

It is possible just one of these stack structures can be disposed in a single light emitting element, but there are preferably two or more, and more preferably three or more. From another standpoint, it is preferable that there are at least two, and more preferably at least three, stack structures disposed in a single light emitting device. In the case where a plurality of light emitting elements are included on a single light emitting device, one or more light emitting elements may not have the stack structure. That is, the stack structure need not be formed at all of the wire bonding sites on a single light emitting element. The stack structure can be disposed on the portion where electrical connection by wire is not intended in a state of not being in contact with any of the sites.

In particular, it is preferable that a stack structure of a first bonding ball, a bonding wire, and a second bonding ball is such that the bonding wire is sandwiched between the first bonding ball and the second bonding ball, and extends from between the first bonding ball and the second bonding ball.

This configuration allows the height of the stack structure to be adjusted easily, and allows good bonding strength of the wire bonding itself to be ensured.

There are no particular restrictions on the total height of the stack structure, but it can be suitably adjusted according to the diameter of the wire being used, the size of the light emitting device, and so on. An example can be a range of about a ten and several microns to 100 µm, with about 20 to 60 µm being preferable. Setting to this range allows the plate-shaped light-transmissive member (discussed below) to be disposed without being in contact with the bonding wire, etc.

The first bonding ball of the stack structure can be formed by a known bonding method, such as ball bonding. For example, the wire is passed through a capillary or other such jig, and high-temperature heat produced by spark or the like is utilized to apply heat and, if desired, a load and/or ultrasonic waves to the tip of the wire, thereby producing a ball by melting the wire. There are no particular restrictions on the temperature here, which can be adjusted according to the material, thickness, and so forth of the wire being used. An example can be a temperature of about 360° C. or lower. There are no particular restrictions on the size of the ball, but usually it can be about 1.2 to 20 times the diameter of the wire, and preferably about 1.5 to 10 times. After this, the ball is bonded on the electrode of the light emitting element.

Consequently, in addition to the height adjustment discussed above and below, the bonding balls can serve as pad electrodes, even if the electrodes are thin films, which reduce or mitigate the damage caused by pressure and the like exerted on the areas where the wire bonds are formed. This allows for more stable bonding.

The first bonding ball is preferably a crimped ball. This form makes it easier to adjust the height, and also ensures good bond strength of the wire bonding itself. During bonding, the ball can be crimped while being subjected to ultrasonic waves.

The height of the first bonding ball can be adjusted by suitably setting the diameter of the wire, the amount of wire to be fed (usually the length of wire played out from the jig), the bonding temperature to which the tip of the wire is subjected, the load on the ball during crimping, and other such conditions. For example, the height of the first bonding ball is preferably about one to three times the diameter of the wire. More specifically, about 10 to 30 µm is preferable, and about 15 to 20 µm is more preferable.

The bonded surface area of the first bonding ball with the electrode can be suitably adjusted. For example, it is about one to three times the diameter of the wire, or about one-third to one time the diameter of the ball.

The first bonding ball can be formed by the following method, for example.

First, a ball formed by melting a wire is crimped onto the electrode of the light emitting element, and a capillary is moved horizontally in any direction, either after being moved slightly upward or not being moved. The "any direction" here can be, for example, a range of about 150 to 210°, if we let a specific part of the wiring pattern to be connected be the 0° position. That is, this is approximately the opposite direction from the wiring pattern to be connected. The distance in which the capillary is moved here is favorably about 10 to 100 µm. After this, the capillary is raised. The capillary is then moved horizontally right over the first bonding ball, after which it is lowered to crimp the capillary on the first bonding ball, and another part of the wire extending from the first bonding ball is crimped on the first bonding ball. When the other part of the wire is crimped on the first bonding ball, this crimping can be performed while applying ultrasonic waves, but the crimping is preferably performed without this application. Thus, performing the crimping twice allows the first bonding ball surface to be made substantially flat, and allows the height of the first bonding ball to be adjusted more reliably.

The bonding wire of the stack structure is sandwiched between the first bonding ball and the second bonding ball, and preferably has a bonding stitch between these.

Therefore, a so-called first bond is formed at a different place from where the first bonding ball was formed, the capillary is raised from the first bond, and the capillary is moved horizontally in the opposite direction from the first bonding ball while the wire is played out. The capillary is then raised, after which the capillary is lowered while being moved toward the first bonding ball, and the wire is preferably pressed against the first bonding ball surface. Here, a bonding stitch (second bond) can be formed over the first bonding ball by deforming the wire with heat, load, and or ultrasonic waves.

The above-mentioned first bonding ball and bonding stitch can be formed by a method known as BSOB (bond stitch on ball).

Examples of the different place from where the first bonding ball was formed include the surface of the substrate to be electrically or non-electrically connected to the electrode of the light emitting element, and more specifically, the surface of the wiring pattern of the substrate. The place where the first bond is formed is preferably disposed at a position that is lower than the first bonding ball.

When a connection is to be made between light emitting elements or between electrodes, it can be on the upper surface of the other light emitting element, or more specifically, on the electrode of the other light emitting element or on the electrode of the same or a different light emitting element.

With a connection between light emitting elements or between electrodes, the first bond can be obtained, for example, by using an FJ loop (a bonding method of the Kaijo Corporation), which is a so-called ultra-low loop. Using a low loop allows the bonding stitch to extend over the first bonding ball, while maintaining substantially the same height of the bonding wire between the light emitting element and the plate-shaped light-transmissive member.

In the case where the bonding wire of the stack structure has a bonding stitch between the first bonding ball and the second bonding ball, the bonding stitch, as discussed above, is pressed over the first bonding ball into an extremely thin film, so the thickness after laminating the bonding stitch and the first bonding ball is substantially the same as the height of the first bonding ball. The term "substantially the same" here means that variance of about ±a several microns can be allowed.

A third bonding ball is preferably formed at the place where the first bond of the bonding wire is formed, by the similar method as that of the first bonding ball. Consequently, the third bonding ball serves effectively as a sort of pad electrode, which reduces or mitigates the damage caused by pressing or the like at the place where the first bond is formed. As a result, a stable bonding can be obtained. The place where the third bonding ball is formed is preferably on the substrate surface, and more preferably is on the surface of the wiring pattern of the substrate. This bonding wire allows the light emitting element and the substrate surface to be electrically connected.

The bonding wire is disposed as a loop that links the third bonding ball and the first bonding ball. As shown in FIG. 1C, the loop in this case has a part that surfaces a direction above the first bond from the first bond, a part in which the direction changes gradually or suddenly toward the first bonding ball, and a part that extends over the first bonding ball at substantially the same height.

Here, the "part that surfaces a direction above the first bond" is preferably at substantially a right angle to the surface of the part where the first bond is formed, but can be slightly inclined toward the light emitting element side. The term "substantially a right angle" here means that variance of about ±5 degrees can be allowed. The inclination to the light emitting element side will depend on the distance from the place where the first bond is formed to the light emitting element, but is preferably from a few degrees to a few dozen degrees. With a loop in which the direction changes gradually toward the first bonding ball, there need not be a distinct boundary between the part that surfaces above the first bond and the part where the direction changes gradually.

The part that extends at substantially the same height is at least the part located between the light emitting element and the plate-shaped light-transmissive member. The term "substantially the same height" here means that the height is substantially the same as the upper surface of the first bonding ball. The presence of this part results in a space corresponding to the height of the first bonding ball and the second bonding ball (discussed below) being disposed above and below this part. This prevents the bonding wire from coming into contact with either the light emitting element or the plate-shaped light-transmissive member, thus damage to the wire and discontinuity of the wire can be prevented.

The highest position of the bonding wire disposed as a loop is preferably at a position that is lower than the uppermost surface of the second bonding ball. This ensures the above-mentioned non-contact state of the bonding wire.

The second bonding ball of the stack structure can be formed in the same way as the first bonding ball.

The diameter of the second bonding ball is preferably the same as or less than the diameter of the first bonding ball in plan view. This allows the light emitted from the light emitting element to be efficiently guided to the plate-shaped light-transmissive member.

Plate-Shaped Light-Transmissive Member

The plate-shaped light-transmissive member allows penetration of light, which is 60% or greater of light emitted from the light emitting element, and further preferably allows penetration of 70% or greater, 80% or greater, or 90% or greater of light emitted from the light emitting element-layer. Such member can be formed by a material such as a resin, for example, a silicone resin, a modified silicone resin, an epoxy resin, a modified epoxy resin, phenolic resin, polycarbonate resin, acrylic resin, trimethylpentene resin, polynorbornene resin, or hybrid resin containing one or more of these resins, and glass and the like.

The plate-shaped light-transmissive member can be in the form of a plate or a sheet, and there are no particular restrictions on its thickness, but about 10 to 500 μm is preferable. A single plate-shaped light-transmissive member preferably has a uniform thickness, but can be locally thicker or thinner, and can have concave, convex, or other such texturing on its upper surface. The planar shape thereof can be suitably adjusted according to the size and shape of the light emitting device, the disposition of the light emitting element, and so on, and the size can be larger than, smaller than, or the same as the upper surface of the light emitting element. It is especially favorable for the size to be large enough to cover the entire upper surface of the light emitting element, that is, for the size to be the same as or larger than the upper surface of the light emitting element. As will be discussed below, when a plurality of light emitting elements are covered, it is preferable for the size to be large enough to cover the entire upper surface of all of these light emitting elements.

It is possible that just one plate-shaped light-transmissive member is disposed for one light emitting element. In this case, one plate-shaped light-transmissive member can be disposed for each light emitting device in which one light emitting element is mounted, or one plate-shaped light-transmissive member can be disposed for each light emitting device in which a plurality of light emitting elements are mounted. Alternatively, two or more plate-shaped light-transmissive members can be disposed for each light emitting device in which a plurality of light emitting elements are mounted. In this case, a plate-shaped light-transmissive member can be disposed for each individual light emitting element, or two or more light emitting elements can be grouped together and one plate-shaped light-transmissive member disposed for each group.

The plate-shaped light-transmissive member can be disposed on the light emitting element, and it is particularly favorable if it is disposed above the above-mentioned stack structure. That is, the plate-shaped light-transmissive member includes two or more stack structures under one plate-shaped light-transmissive member. In other words, one plate-shaped light-transmissive member is preferably disposed on two or more stack structures, supported by the stack structures. This allows the plate-shaped light-transmissive member to be more stably disposed on the stack structures.

The plate-shaped light-transmissive member can comprise a fluorescent material and/or a diffusion material. These can be contained in the material of the plate-shaped light-transmissive member, or a layer containing them can be disposed above, between, or under.

The fluorescent material can have a configuration that is known in this technical field, and includes for example, a YAG fluorescent material activated by cerium, LAG fluorescent material activated by cerium, a carcium aluminosilicate containing nitride fluorescent material activated by europium and/or chromiun ($CaO$—$Al_2O_3$—$SiO_2$), a silicate fluorescent material activated by europium ($(Sr,Ba)_2SiO_4$), beta sialon fluorescent material, KSF fluorescent material ($K_2SiF_6$:Mn), minute semiconductor particles that are termed quantum dot fluorescent material, and the like. In this manner, it is possible to configure a light emitting device that emits mixed colored light containing a primary light and a secondary light in visible wavelengths (for example, white light), and to configure a light emitting device that is excited by ultraviolet primary light to thereby emit secondary light in visible wavelengths. Using a fluorescent material which exhibits a broad yellow excited by blue light is preferable as a fluorescent material configured to be excited by blue light emitted from the light emitting element to thereby emit white light. For example, YAG fluorescent materials and BOS (Barium ortho-Silicate) fluorescent materials are preferable. When the plate-shaped light-transmissive member includes such fluorescent material, the concentration thereof is preferably 5 to 50 weight % with respect to the total weight of the plate-shaped light-transmissive member.

Further, it is possible to adjust the color rendering properties and the color reproduction by using the fluorescent materials such as $Si_{6-z}Al_zO_zN_{8-z}$:Eu, $Lu_3Al_5O_{12}$:Ce, $BaMgAl_{10}O_{17}$:Eu, $BaMgAl_{10}O_{17}$:Eu,Mn, (Zn,Cd)Zn:Cu, $(Sr,Ca)_{10}(PO_4)_6C_{12}$:Eu,Mn, $(Sr,Ca)_2Si_5N_8$:Eu, $CaAlSiB_xB_{3+x}$:Eu, $K_2SiF_6$:Mn and $CaAlSiN_3$:E, etc., in addition to the yellow fluorescent material Examples of the diffusion material include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, a crystalline or sintered body of the fluorescent material, or a sintered body of an inorganic bonding material and the fluorescent material, or the like.

Light Transmissive Member

The light transmissive member preferably comprises a light transmission material between the plate-shaped light-transmissive member and the light emitting element as an adhesive agent in order to be disposed above the stack structure.

As long as adhesion can be ensured between the plate-shaped light-transmissive member and the light emitting element, the light transmissive member can be formed from the same material as the plate-shaped light-transmissive member. Also, the light transmissive member can comprise a fluorescent material and/or a diffusion material or the like. Examples of the fluorescent material and diffusion material here are the similar to as those given above. The fluorescent material and/or diffusion material is preferably contained in the material that makes up the light transmissive member.

The light transmissive member should be disposed at least in contact with the upper surface of the light emitting element and the lower surface of the plate-shaped light-transmissive member, but is preferably disposed in contact with the side surfaces of the stack structure so as to surround the stack structure. It is preferably disposed so as to surround part of the bonding wire that makes up the stack structure, and especially the entire periphery of the bonding wire located directly above the light emitting element (that is, above the light emitting element and within the outer edge; the same applies hereinafter). This reliably prevents damage to the bonding wire attributable to contact between the bonding wire and the plate-shaped light-transmissive member, etc. The light transmissive member can be disposed between and in contact with the upper surface of the stack structure and the lower surface of the plate-shaped light-transmissive member. Also, the light transmissive member can be disposed not only directly over the light emitting element, but also spreading out from the outer edge of the light emitting element toward the plate-shaped light-transmissive member side.

The thickness of the light transmissive member is preferably substantially the same as the total height of the stack structure.

The light transmissive member can be formed by potting, screen printing, or the like.

Light Reflecting Member

At least part of the side surface of the light emitting element is preferably covered by a light reflecting member, and more preferably the entire side surface is covered. This allows the light emitted laterally from the light emitting element to be efficiently extracted upward. Also, when the above-mentioned light transmissive member is disposed, at least part of the side surface thereof, and preferably all of it, is preferably covered by the light reflecting member. Therefore, the light reflecting member is preferably disposed so as to surround part of the bonding wire that makes up the stack structure, and especially all or part of the periphery of the bonding wire extending outside the outer edge of the light emitting element from directly above the light emitting element.

The light reflecting member are preferably formed by a reflective material so that its reflectivity of light from the light emitting element will be at least 60%, and preferably at least, 70%, 80%, or 90%.

Examples of the reflective material include, for example, ceramics, resin, dielectrics, pulp, glass, composites of these materials. Among these, a resin is preferable from the standpoint of being able to easily form the desired shape.

Examples of the resin include a thermosetting resin and a thermoplastic resin. Specific Examples of such a resin include resins or hybrid resins which include at least one of a silicone resin; a modified silicone resin, an epoxy resin; a modified epoxy resin; an acrylic resin.

The materials, in particular, the resin is preferably contained a light reflecting material such as titanium dioxide, silicon dioxide, zirconium dioxide, potassium titanate, alumina, aluminum nitride, boron nitride, mullite, niobium oxide, barium sulfate, carbon black, various rare earth oxides (e.g., yttrium oxide, gadolinium oxide, etc.), a light scattering material or a colorant. Further, the materials, in particular, the resin can also contain a fibrous filler such as glass fiber, wollastonite, an inorganic filler such as carbon, a material having a high heat dissipation such as aluminium nitride and the like.

The light reflective member can be formed by screen printing, potting, transfer molding, compression molding, or the like.

In addition to the light emitting element, a protective element, a protective cicuit or the like can be mounted in the light emitting device according to embodiments of the present invention. There can be one protective element, or there can be two or more protective elements. The protective element is not specifically limited and any known protective elements in the art may also be used in the light emitting device. More specifically, a Zener diode can be used.

Embodiment of the present invention will now be described through reference to the drawings.

Embodiment 1

Figure 1C:
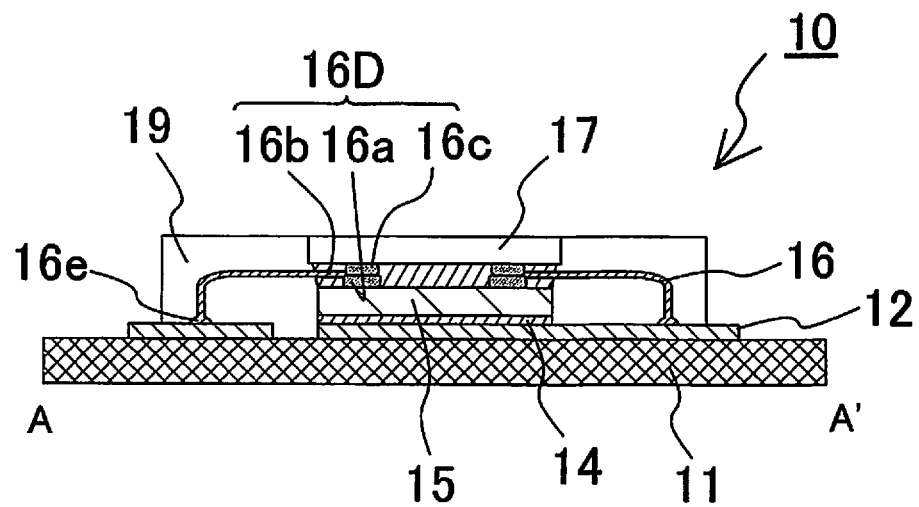
FIG. 1C is a cross section along the A-A' line in FIG. 1A.
Figure 1D:
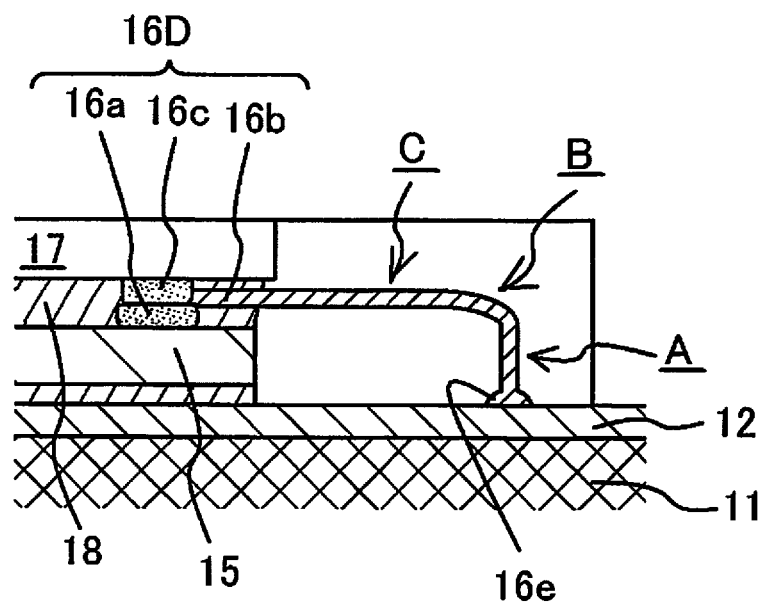
FIG. 1D is a simplified enlarged view of the main components of the light emitting device in FIG. 1C.

The light emitting device 10 in this embodiment is shown in FIGS. 1A, 1B, 1C, and 1D. The plate-shaped light-transmissive member 17 and the light reflecting member 19 in FIG. 1A are omitted in FIG. 1B. Also, a bonding wire 16*b* between a first bonding ball 16*a* and a second bonding ball 16*c* in the stack structure is omitted in FIGS. 1C and 1D as it is so thin.

The light emitting device 10 comprises a substrate 11, light emitting elements 15 mounted on the upper surface of the substrate 11, wires 16 that are electrically connected to the light emitting elements 15, and the plate-shaped light-transmissive member 17 that covers the light emitting elements 15. There are also provided a light transmissive member 18 that is disposed between the light emitting elements 15 and the plate-shaped light-transmissive member 17, and the light reflecting member 19 that covers the side surfaces of the light emitting elements 15.

The substrate 11, for example, has wiring pattern 12 formed in a pattern by vapor deposition of Ti, Pd, or Au on the surface of a flat material composed of aluminum nitride, and gold plating is performed over this wiring pattern 12. The wiring pattern 12 includes a pair of patterns extending to both sides of the substrate 11, as well as a pattern on which the light emitting elements 15 are mounted and serially connected.

The light emitting elements 15 mounted on the substrate 11 are separated from one another, and four of them are mounted in a straight line, for example.

The light emitting elements 15 have positive and negative electrodes formed on their surfaces, and are flip-chip mounted by a bonding member 14 on the substrate 11.

The electrodes of the light emitting elements 15 are electrically connected to the wires 16, and are also electrically connected to the wiring pattern 12.

The wires 16 each have at one end a stack structure 16D in which a first bonding ball 16*a*, a bonding wire 16*b*, and a second bonding ball 16*c* are stacked in that order. This stack structure is disposed on the upper surface of the light emitting elements 15. Here, the height of the first bonding balls 16*a* and the second bonding balls 16*b* is about 15 to 40 μm, and the total height of the stack structure 16D is about 30 to 80 μm. Four of the stack structures 16D are disposed substantially at the four diagonal corners of each of the light emitting elements 15, which are mounted four in a row.

The wires 16 have at the other end a third bonding ball 16*e*, and are connected to the surface of the wiring 12.

The wires 16 have a part A extending upward from the third bonding ball, a part B where the extension direction changes toward the first bonding ball 16*a*, and a part C that extends over the first bonding ball while maintaining substantially the same height and becomes the bonding wire 16*b*.

The part A extends at a substantially right angle with respect to the surface of the wiring 12.

The part B is such that the direction gradually changes from the part A toward the first bonding ball 16*a*.

The part C extends from the part B so as to maintain substantially the same height as that of the upper surface of the first bonding ball 16*a*.

Therefore, the highest part of the wires 16 is located lower than the upper surface of the second bonding ball 16*c*.

Four of the stack structures 16D formed by the wires 16 are formed on each of the light emitting elements 15.

A protective element 13 is further disposed on the wiring pattern 12 of the substrate 11.

The plate-shaped light-transmissive member 17 covers all of the four light emitting elements 15 mounted on the substrate 11, and has a size that is slightly larger than the peripheral shape of the four light emitting elements 15 (about 12% larger than the peripheral shape of the four light emitting elements). The plate-shaped light-transmissive member 17 has a uniform thickness of about 0.2 mm, for example. The plate-shaped light-transmissive member 17 is disposed above the total of 16 stack structures mentioned above.

The plate-shaped light-transmissive member 17 is formed by mixing and sintering YAG and alumina. A YAG fluorescent material is contained in a total weight of 5 to 15 wt % of the plate-shaped light-transmissive member 17.

The light transmissive member 18 is further disposed between the light emitting elements 15 and the plate-shaped light-transmissive member 17. The light transmissive member 18 is made of a silicone resin and it is cured by heat. The light transmissive member 18 is disposed to surround the entire upper surface of the light emitting elements 15, around the wires 16 located directly above the light emitting elements 15, and around the stack structures.

The side surfaces of the light emitting elements 15 are covered by the light reflecting member 19.

The light reflecting member 19 contains about 30 wt % titanium oxide in a silicone resin.

The light reflecting member 19 located between the light emitting elements 15 is formed continuously. The light reflecting member 19 also covers the side surfaces of the plate-shaped light-transmissive member 17 and the light transmissive member 18, and has an upper surface that lies in the same plane as the upper surface of the plate-shaped light-transmissive member 17.

Even when the light emitting elements are face-up mounted in this way, the stack structures constituted by the wires include a first bonding ball, a bonding wire, and a second bonding ball stacked in that order on the upper surfaces of the light emitting elements, so the space between the upper surfaces of the light emitting elements and the plate-shaped light-transmissive member that covers the light emitting elements can be positively maintained at a desired size. This effectively prevents the bonding wires, which are electrically connected to the light emitting elements, from coming into contact with the upper surfaces of the light emitting elements, the lower surfaces and side surfaces of the plate-shaped light-transmissive member, and so forth. As a result, a highly reliable light emitting device can be obtained, in which no damage and discontinuity of the wire occurs.

Embodiment 2

Figure 2A:
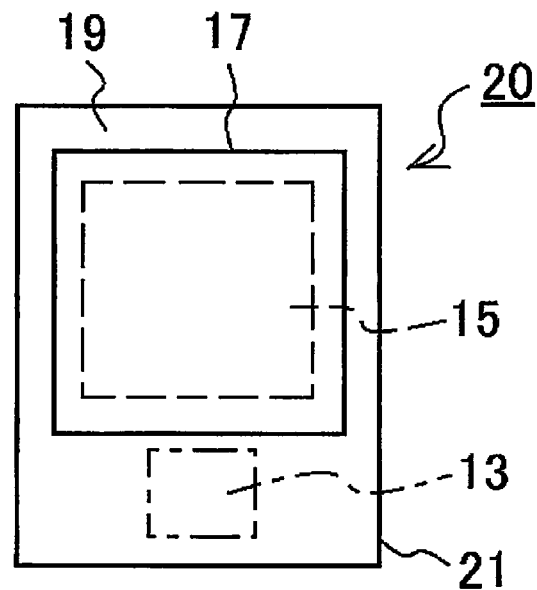
FIG. 2A is a simplified plan view of the main components in another embodiment of the light emitting device of the present invention.
Figure 2B:
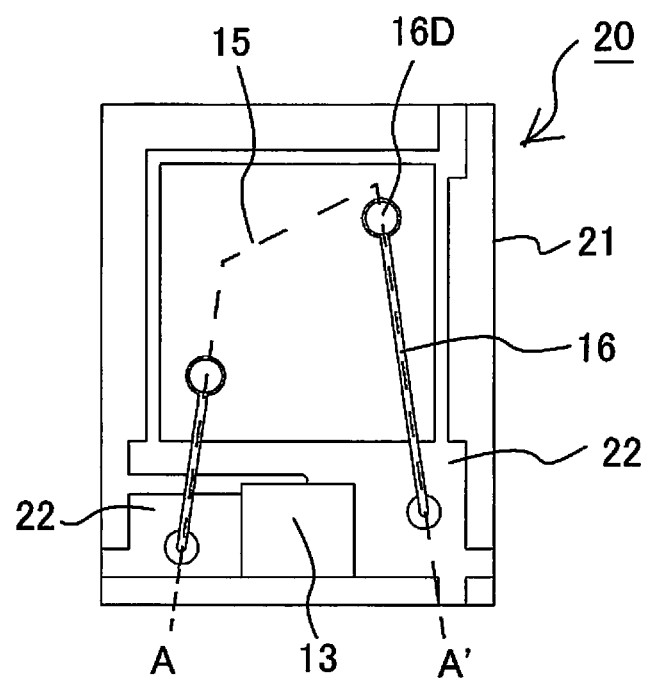
FIG. 2B is a simplified plan view of the main components of the light emitting device in FIG. 2A, with the plate-shaped light-transmissive member and the light reflecting member omitted.
Figure 2C:
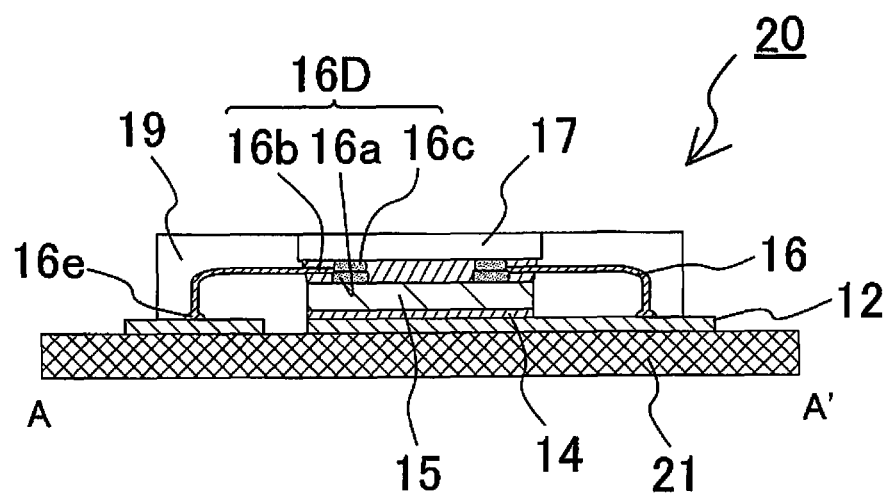
FIG. 2C is a cross section along the A-A' line in FIG. 2A.

The light emitting device 20 in this embodiment is shown in FIGS. 2A, 2B, and 2C. The plate-shaped light-transmissive member 17 and the light reflecting member 19 shown in FIG. 2A are omitted in FIG. 2B.

This light emitting device 20 is a chip-size package (CSP), in which a pair of positive and negative wiring patterns 22 are formed on a substrate 21. Structures other than that a single protective element 13 and a single light emitting element 15 are disposed on this substrate 21 are substantially the same as those in the light emitting device 10 of Embodiment 1.

INDUSTRIAL APPLICABILITY

A light emitting device having a light emitting element according to the present disclosure can be suitably employed for various lighting apparatuses, in particular, a light source for lighting, an LED display, backlight source for a cell phone, signals, a lighted switch, car-mounted stop lump, various sensors, various indicators in addition to lighting apparatuses using image reading system of fax machine, copying machine or hand scanner, with high reliability. Further, wire bonding for various light emitting devices such as ICs, memories can be widely-applied.

It is to be understood that although the present invention has been described with regard to preferred embodiments thereof, various other embodiments and variants can occur to those skilled in the art, which are within the scope and spirit of the invention, and such other embodiments and variants are intended to be covered by the following claims.

What is claimed is:

1. A light emitting device comprising:
   a substrate;
   a light emitting element mounted on an upper surface of the substrate;
   a wire electrically connected to the light emitting element, the wire including a stack structure, the stack structure being constituted of a first bonding ball, a bonding wire, and a second bonding ball stacked in this order on an upper surface of the light emitting element, a highest position of the bonding wire being disposed at a position that is lower than an uppermost surface of the second bonding ball, the wire further including a third bonding ball disposed on the upper surface of the substrate, the bonding wire having a vertical linear portion extending from the third bonding ball in a direction normal to the substrate and a horizontal linear portion extending from a position between the first bonding ball and the second bonding ball in a direction parallel to the substrate;
   a plate-shaped light-transmissive member disposed over the stack structure and covering an entirety of the upper surface of the light emitting element, the plate-shaped light-transmissive member including a fluorescent material;
   a light transmissive member disposed between the plate-shaped light-transmissive member and the light emitting element, the light transmissive member covering an entire region of the upper surface of the light emitting element in which the stack structure is not arranged, the stack structure being embedded in the light transmissive member arranged directly below the plate-shaped light-transmissive member, the light transmissive member filling a space between the bonding wire and the plate-shaped light transmissive member such that the bonding wire does not contact the plate-shaped light transmissive member; and
   a light reflecting member covering and in contact with a side surface of the light emitting element with at least a part of the bonding wire being embedded in the light reflecting member, wherein
   a lower surface of the first bonding ball is bonded to the upper surface of the light emitting element, and an upper surface of the second bonding ball is bonded to a lower surface of the plate-shaped light transmissive member, with a bonding area between the upper surface of the second bonding ball and the lower surface of the plate-shaped light transmissive member being smaller than a bonding area between the lower surface of the first bonding ball and the upper surface of the light emitting element.

2. The light emitting device according to claim 1, wherein the first bonding ball and the second bonding ball are crimped balls.

3. The light emitting device according to claim 1, wherein the bonding wire includes a bonding stitch between the first bonding ball and the second bonding ball.

4. The light emitting device according to claim 1, wherein a plurality of the light emitting elements are mounted on the upper surface of the substrate and the plate-shaped light-transmissive member covers the plurality of the light emitting elements.

5. The light emitting device according to claim 1, wherein two or more stack structures are disposed under the plate-shaped light-transmissive member.

6. The light emitting device according to claim 1, wherein the light transmissive member includes a fluorescent material.

7. The light emitting device according to claim 1, wherein the light reflecting member covers a side surface of the light transmissive member.

8. The light emitting device according to claim 1, wherein the upper surface of the second bonding ball is bonded to the lower surface of the plate-shaped light-transmissive member by the light transmissive member.

9. The light emitting device according to claim 1, wherein
a diameter of the second bonding ball is smaller than a diameter of the first bonding ball in plan view.

10. The light emitting device according to claim 1, wherein
the wire is made of material containing Au, Ag, Cu, Pt or Al, or alloy of Au, Ag, Cu, Pt or Al.

11. The light emitting device according to claim 1, wherein
a total height of the stack structure is in a range of about a ten and several micrometers to 100 micrometers.

12. The light emitting device according to claim 1, wherein
the uppermost surface of the second bonding ball includes a substantially flat surface.

13. The light emitting device according to claim 1, wherein
the light emitting element, the plate-shaped light-transmissive member, the first bonding ball and the second bonding ball are in contact with the light transmissive member.

14. The light emitting device according to claim 1, wherein
a size of the plate-shaped light-transmissive member is larger than a size of the light emitting element.

15. The light emitting device according to claim 1, wherein
the plate-shaped light-transmissive member is an insulating member.

* * * * *